(12) United States Patent
Murai et al.

(10) Patent No.: US 10,462,950 B2
(45) Date of Patent: Oct. 29, 2019

(54) ELECTRONIC COMPONENT BONDING DEVICE AND ELECTRONIC COMPONENT MOUNTER

(71) Applicant: FUJI CORPORATION, Chiryu-shi (JP)

(72) Inventors: Masaki Murai, Nishio (JP); Toshihiko Yamasaki, Nisshin (JP); Toshinori Shimizu, Kariya (JP)

(73) Assignee: FUJI CORPORATION, Chiryu-shi (JP)

( * ) Notice: Subject to any disclaimer, the term of this patent is extended or adjusted under 35 U.S.C. 154(b) by 45 days.

(21) Appl. No.: 15/575,987

(22) PCT Filed: May 22, 2015

(86) PCT No.: PCT/JP2015/064692
§ 371 (c)(1),
(2) Date: Nov. 21, 2017

(87) PCT Pub. No.: WO2016/189576
PCT Pub. Date: Dec. 1, 2016

(65) Prior Publication Data
US 2018/0153060 A1 May 31, 2018

(51) Int. Cl.
*B32B 37/00* (2006.01)
*H05K 13/04* (2006.01)
(Continued)

(52) U.S. Cl.
CPC ........... *H05K 13/046* (2013.01); *H01L 24/75* (2013.01); *H05K 3/32* (2013.01); *H05K 13/02* (2013.01);
(Continued)

(58) Field of Classification Search
CPC ........ H05K 13/046; H05K 3/32; H05K 13/02; H05K 13/0408; H05K 13/0413; H01L 24/75; B30B 9/04
(Continued)

(56) References Cited

U.S. PATENT DOCUMENTS 6,544,377 B1 * 4/2003 Minamitani .......... H01L 21/563
156/299
2007/0175021 A1 8/2007 Speckels et al.
(Continued)

FOREIGN PATENT DOCUMENTS

JP 3-225842 A 10/1991
JP 03-225842 A 10/1991
(Continued)

OTHER PUBLICATIONS

International Search Report dated Aug. 11, 2015, in PCT/JP2015/064692 filed May 22, 2015.
(Continued)

*Primary Examiner* — James D Sells
(74) *Attorney, Agent, or Firm* — Oblon, McClelland, Maier & Neustadt, L.L.P.

(57) ABSTRACT

An electronic component bonding device includes multiple pressing tools that apply pressure to a die on the bonding section of a circuit board, the multiple pressing tools are supported on a support block via a following mechanism so as to be able to be inclined in any direction around 360 degrees, and a driving mechanism that moves the support blocks vertically is provided. The multiple support blocks are arranged in a width direction of the circuit board, and when the circuit board is conveyed by a conveyor such that the die on the bonding section of the circuit board has reached below one of the multiple support blocks, conveyance of the circuit board is stopped, the support block is
(Continued)

lowered by the support block driving mechanism, and the die is bonded to the bonding section of the circuit board using the pressing tool of the support block.

7 Claims, 4 Drawing Sheets

(51) Int. Cl.
  *H05K 3/32* (2006.01)
  *H05K 13/02* (2006.01)
  *H01L 23/00* (2006.01)
(52) U.S. Cl.
  CPC ..... *H05K 13/0408* (2013.01); *H05K 13/0413* (2013.01); *H01L 2224/7592* (2013.01); *H01L 2224/7598* (2013.01); *H01L 2224/75301* (2013.01); *H01L 2224/75651* (2013.01); *H01L 2224/75823* (2013.01); *H01L 2924/3511* (2013.01)
(58) Field of Classification Search
  USPC ........................................................ 156/580
  See application file for complete search history.

(56) References Cited

U.S. PATENT DOCUMENTS

| 2009/0020229 A1 | 1/2009 | Yoon et al. |
| 2012/0127485 A1 | 5/2012 | Yamauchi |
| 2016/0084638 A1 | 3/2016 | Yamauchi |

FOREIGN PATENT DOCUMENTS

| JP | 06-031145 U | 4/1994 |
| JP | 6-216201 A | 8/1994 |
| JP | 06-216201 A | 8/1994 |
| JP | 7-74214 A | 3/1995 |
| JP | 07-074214 A | 3/1995 |
| JP | 10-64958 A | 3/1998 |
| JP | 10-064958 A | 3/1998 |
| JP | 10-321673 A | 12/1998 |
| JP | 11-330156 A | 11/1999 |
| JP | 3427672 B2 | 7/2003 |
| JP | 3583868 B2 | 11/2004 |
| JP | 2008-258473 A | 10/2008 |

OTHER PUBLICATIONS

Extended European Search Report dated May 2, 2018 in Patent Application No. 15893212.9.

* cited by examiner

ELECTRONIC COMPONENT BONDING DEVICE AND ELECTRONIC COMPONENT MOUNTER

TECHNICAL FIELD

The present application relates to an electronic component bonding device and an electronic component mounter for bonding an electronic component loaded on a bonding section of a circuit board to the bonding section of the circuit board by applying pressure to the electronic component using a pressing tool.

BACKGROUND ART

With an electronic component bonding device, if a lower surface of a pressing tool is inclined with respect to the upper surface (pressed surface) of an electronic component on a circuit board, the lower surface of the pressing tool contacts the upper surface of the electronic component unevenly, meaning that pressing force is applied locally to a certain portion of the electronic component by the pressing tool, leading to problems during bonding such as positional deviation of the electronic component or an uneven bonding state of the electronic component, which lower the reliability of mounting.

To solve these problems, as disclosed in patent literature 1 (JPA-H11-330156) and patent literature 2 (JPA2008-258473), an incline measuring device for detecting an incline of the pressing tool, an incline of the electronic component (circuit board), an incline of the stage on which the circuit board is loaded, or the relative levelness of the stage (circuit board) and pressing tool is provided along with an incline adjustment device for adjusting the incline of the pressing tool or the incline of the stage, and before starting production, the incline of the pressing tool or the like is measured using the incline measuring device, and based on a measurement value, the incline of the pressing tool or the incline of the stage is adjusted using the incline adjusting device, and then production is started.

CITATION LIST

Patent Literature

Patent literature 1: JP-A-H11-330156
Patent Literature 2: JP-A-2008-258473

SUMMARY

Technical Problem

Using a configuration as in the above patent literature 1 and 2 in which, before starting production, the incline of the pressing tool or the like is adjusted using the incline adjusting device in accordance with the incline of the pressing tool or the like measured by the incline measuring device is problematic in that the configuration of the electronic component bonding device is complex and the manufacturing cost of the electronic component bonding device is high. Also, it is necessary to, before starting production, add an incline measuring step for measuring the incline of the pressing tool or the like using the incline measuring device, and an incline adjusting step for adjusting the incline of the pressing tool or the like based on the measured value using the incline adjusting device, leading to the disadvantages of increased steps and lower productivity.

Thus, to solve the above problems, an object of the present disclosure is to automatically adjust the incline of a pressing tool to match the incline of a bonding section (electronic component) of a circuit board during bonding operation so as to evenly apply pressure to the electronic component and bond it accurately to the bonding section of the circuit board, without performing an inclining measuring step or an incline adjusting step before starting production.

Solution to Problem

To solve the above problems, the present disclosure is an electronic component bonding device for applying pressure to an electronic component loaded on a bonding section of a circuit board so as to bond the electronic component to the bonding section of the circuit board, the electronic component bonding device including: multiple pressing tools configured to apply pressure to the electronic component on the bonding section of the circuit board; a support block configured to support each of the multiple pressing tools via a following mechanism that allows the pressing tool to incline in any direction around 360 degrees; and a drive mechanism configured to drive the support block in a vertical direction, and, via lowering operation, apply pressure to the electronic component on the bonding section of the circuit board using one of the multiple pressing tools and bond the electronic component to the bonding section of the circuit board.

With this configuration, because a support block is configured to support each of the multiple pressing took via a following mechanism that allows the pressing tool to incline in any direction around 360 degrees, when the support block is lowered by the driving mechanism and pressure is applied to the electronic component on the bonding section of the circuit board by the pressing tool, an incline of the pressing tool is automatically adjusted by the following mechanism to match the incline of the electronic component on the bonding section of the circuit board, such that the electronic component is bonded to the bonding section of the circuit board with high accuracy with pressure being applied evenly to the electronic component while levelness is maintained between the pressing tool and the electronic component (bonding section of the circuit board). Accordingly, without performing an incline measuring step or an incline adjustment step before starting production, it is possible to maintain mounting reliability of the electronic component and improve productivity while not needing a conventional incline measuring device or incline adjustment device, therefore manufacturing costs of the electronic component bonding device are reduced. Further, because multiple pressing tools are supported on a single support block via a following mechanism, it is possible to move multiple pressing tools in a vertical direction using a single driving mechanism, such that the configuration of the driving system can be simplified, pressure can be applied to multiple electronic components by the multiple pressing tools of the single support block at the same time, or pressure can be applied to a single electronic component by the multiple pressing tools at the same time, meaning that various production types (size of component to be bonded, component quantity, board size, and so on) can be handled. In this case, because the multiple pressing tools supported by the support block are each able to incline via the following mechanism in any direction around 360 degrees, it is easier to perform incline adjustment on each pressing tool individually, to match the unevenness of the circuit board or the incline of the electronic component.

Note that, in a case in which the quantity of electronic components to be bonded to the circuit board is small, or a case in which the circuit board is small, the electronic component bonding device may be provided with only one support block, but for bonding electronic components to a large circuit board, it is good if multiple support blocks are provided, each support block is provided with a driving mechanism, and each support block is driven individually in a vertical direction by the respective driving mechanisms. According to this configuration, even when bonding a relatively large amount of electronic components onto a large circuit board, it is possible to perform bonding onto the bonding section of the circuit board with high accuracy while applying pressure evenly to each electronic component and maintaining a state of levelness between each of the multiple pressing tools of the multiple support blocks and the respective electronic components (bonding sections of circuit board). In this case, it is not necessary to simultaneously lower all of the multiple support blocks, it is fine to lower only the support block positioned above the electronic component on the bonding section of the circuit board.

Further, the present disclosure may be provided with provided with a conveyor configured to convey the circuit board, wherein the multiple support blocks are arranged in a width direction of the circuit board conveyed by the conveyor, and when the circuit board is conveyed by the conveyor such that the electronic component on the bonding section of the circuit board has reached below one of the multiple support blocks, conveyance of the circuit board is stopped, the support block is lowered by the support block driving mechanism, and the electronic component is bonded to the bonding section of the circuit board using the pressing tool of the support block. According to this configuration, even without moving the support in a horizontal direction (an X direction and/or a Y direction), it is possible to move the electronic component on the bonding section of the circuit board below the support block, and to bond the electronic component to the bonding section of the circuit board. However, with the present disclosure, the support block may be moved in a horizontal direction with respect to a stationary circuit board, with the support block being moved above the electronic component on the bonding section of the circuit board and then bonding performed, that is, at least one of the support block or the circuit board may be moved in the horizontal direction, the support block and the electronic component on the bonding section of the circuit board may be moved vertically, and then bonding performed.

Also, the present disclosure may be provided with a pressure detecting means configured to detect a pressure force applied to the electronic component on the bonding section of the circuit board by the pressing tool; and a control device configured to control lowering operation of the support block by the driving mechanism such that the pressure force during bonding detected by the pressure detecting means is specified value A. According to this configuration, it is possible to control the pressure force while bonding to a target pressure force (specified value A). In this case, feedback control may be performed such that the support block is lowered during each bonding operation such that the detection value of the pressure force is specified value A, or, the pressure force during bonding may be detected during testing before production, and production may be started after deciding a lowering amount for the support block such that the pressure force during bonding operation is specified value A. Alternatively, the pressure force during bonding may be monitored during production, and if the pressure force during bonding increases or decreases outside a range from target value A to specified value B, the lowering amount of the support block may be increased or decreased by specified amount C.

With the present disclosure, the support block may be attached to be exchangeable with a support block for which the quantity of the pressing tool and/or the size of the pressing tool is different. According to this configuration, the quantity or size of the pressing tools of the support blocks can be easily changed during changeover to suit the production type (size of components to be bonded, component quantity, board size, and so on), and changeover workability is improved.

An electronic component bonding device of the present disclosure may be configured separately to an electronic component mounter that mounts electronic components on a circuit board, and arranged in a line such that the electronic component bonding device of the present disclosure is on the board unloading side of the electronic component mounter, or the electronic component bonding device of the present disclosure may be provided inside the electronic component mounter.

DESCRIPTION OF EMBODIMENTS

Figure 1:
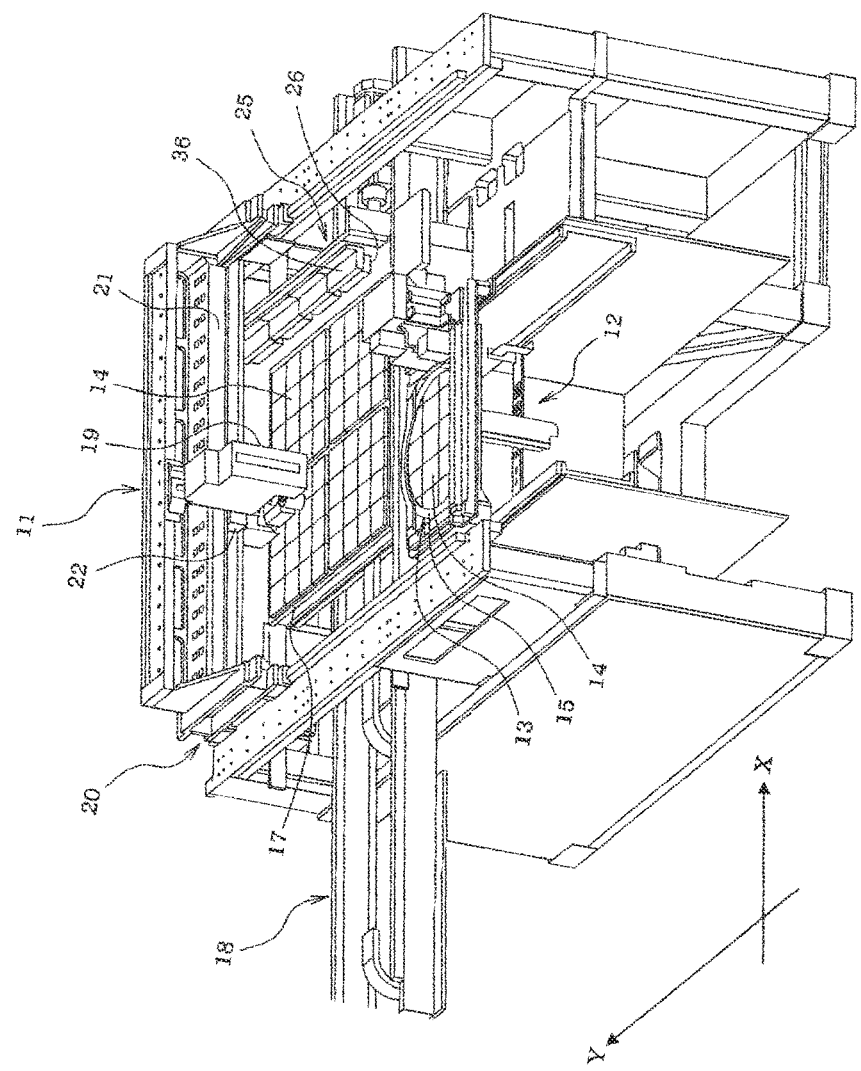
FIG. 1 is a perspective view of an electronic component mounter that is an embodiment of the present disclosure.
Figure 2:
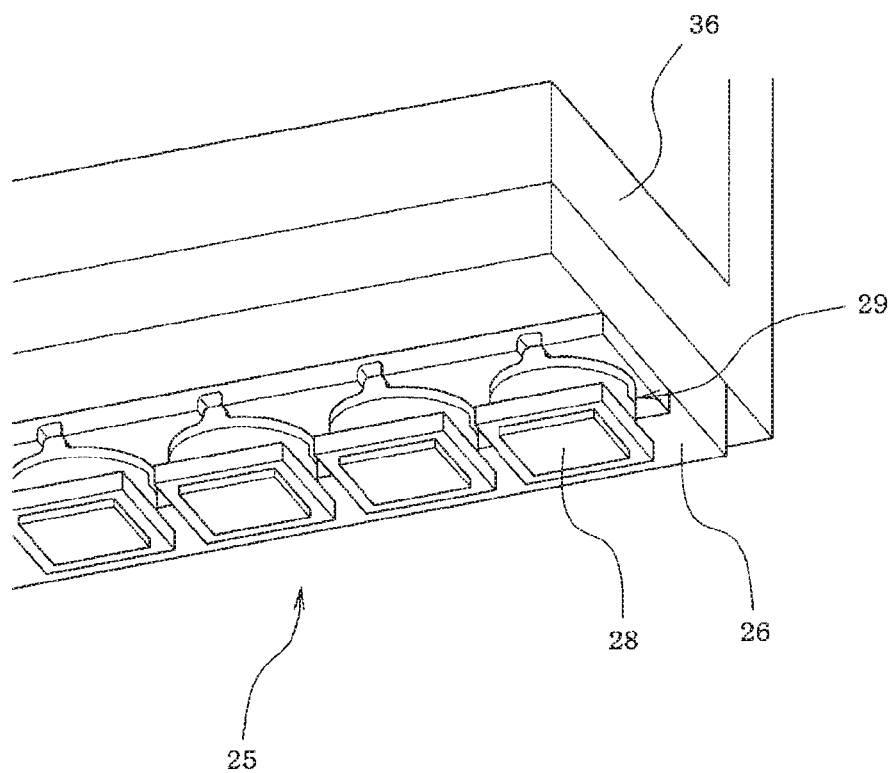
FIG. 2 is a perspective view of a pressing tool of an electronic component bonding device and a surrounding portion.

An embodiment of the disclosure is described below. First, the configuration of electronic component mounter 11 will be described based on FIG. 1.

Die supply device 12, which is an electronic component supply device, is removably set on electronic component mounter 11. Note that, in FIG. 1, only a portion of die supply device 12 is shown, other portions are omitted. Provided in die supply device 12 are a magazine (not shown) that stores wafer pallets 13 in multiple levels, and a pallet unloading and loading mechanism (not shown) that unloads and loads wafer pallets 13 from and to the magazine. Wafer pallet 13 is configured to hold an expandable dicing sheet (not shown) to which a diced wafer diced into many separated dies 14 (electronic components) is attached, with the dicing sheet being affixed in an expanded state to dicing frame 15 that has a circular opening.

Component mounter 11 is provided with conveyor 18 that conveys circuit board 17 in an X direction, and XY moving mechanism 20 (XY robot) that moves mounting head 19 in XY-directions (right-left and front-rear directions). XY moving mechanism 20 includes Y slide 21 that slides in a Y direction (a direction perpendicular to a conveyance direction of circuit board 17) and X slide 22 that is supported on Y slide 21 so as to be slidable in an X direction (the conveyance direction of circuit board 17); mounting head 19 is attached to X slide 22.

One or multiple suction nozzles (not shown) that pick up die 14 from wafer pallet 13 of die supply device 12 and mount the die 14 on circuit board 17, and a mark camera (not shown) that captures an image of an imaging target such as reference marks of circuit board 17 from above are provided on mounting head 19 of component mounter 11.

Electronic component bonding device 25 that applies pressure to die 14, which is an electronic component, loaded on a bonding section of circuit board 17 from above to bond the die 14 to the bonding section of the circuit board 17 is provided at the unloading side of circuit board 17 in component mounter 11. The configuration of electronic component bonding device 25 is described below with reference to FIGS. 2 to 5.

Electronic component bonding device 25 is provided with multiple support blocks 26 arranged in a line in a width direction (Y direction, which is perpendicular to the conveyance direction) of circuit board 17 that is conveyed on conveyor 18, and multiple driving mechanisms 27 (refer to FIG. 3) that individually drive each of the multiple support blocks 26 in a vertical direction, and on each support block 26, multiple pressing tools 28 are supported individually facing down via following mechanism 29, with each pressing tool 28 being able to be inclined in any direction around 360 degrees by each of the following mechanisms 29. The multiple pressure tools 28 of each support block 26 are arranged in a line in the width direction (Y direction) of circuit board 17. Accordingly, the multiple pressing tools 28 supported on the multiple support blocks 26 of electronic component bonding device 25 are arranged such that bonding is possible across the entire width of circuit board 17. Further, in the present embodiment, each support block 26 is attached to raising and lowering member 36 (refer to FIG. 3) of each driving mechanism 27 to be exchangeable with a support block 26 for which the quantity of the pressing tools and/or the size of the pressing tools is different.

Figure 3:
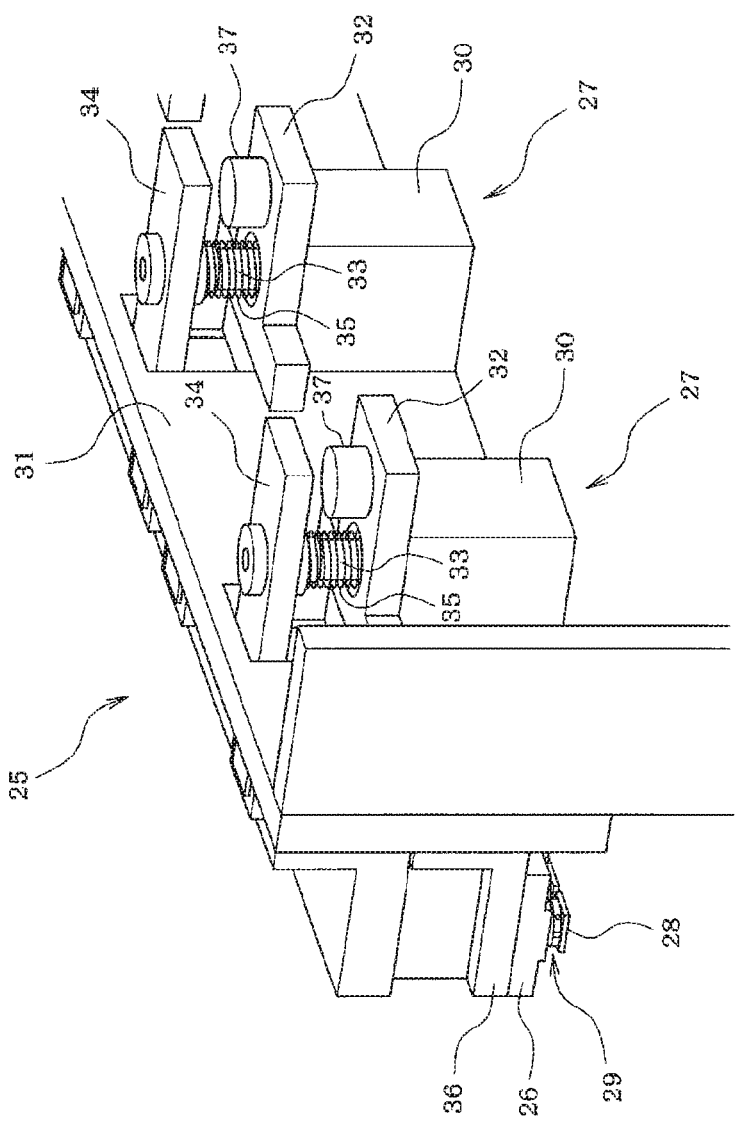
FIG. 3 is a perspective view of a pressing tool of a driving mechanism of an electronic component bonding device and a surrounding portion.

As shown in FIG. 3, each driving mechanism 27 that drives the respective support blocks 26 in the vertical direction uses an air cylinder 30 as a drive source, with each air cylinder 30 being fixed to the lower surface of cylinder attachment member 32 of main body frame 31 of electronic component bonding device 25, and, connecting member 34 of raising and lowering member 36 that supports each support block 26 is fixedly connected to an upper end section of rod 33 that protrudes from upwards from air cylinder 30. Rod 33 is biased upwards by elastic force of spring 35 attached to rod 33 of each air cylinder 30, and when air cylinder 30 is not operating, rod 33 protrudes upwards due to elastic force of spring 35 such that support block 26 is held at a standby position that is an upper limit position of the movement range in the vertical direction.

Load cell 37 is fixed to the upper surface side of cylinder attachment member 32 of each air cylinder 30 as a pressure detecting means that detects a pressure force applied on die 15 on the bonding section of circuit board 17 by pressing tool 28, so as to face connecting member 34 that raises and lowers as one body with each support block 26. When air cylinder 30 operates to lower rod 33 such that connecting member 34 lowers as one with support block 26, by connecting member 34 contacting load cell 37, a signal in accordance with the force of connecting member 34 pushing down on load cell 37 is outputted from load cell 37 to control device 38 (control means) of electronic component mounter 11.

Figure 4:
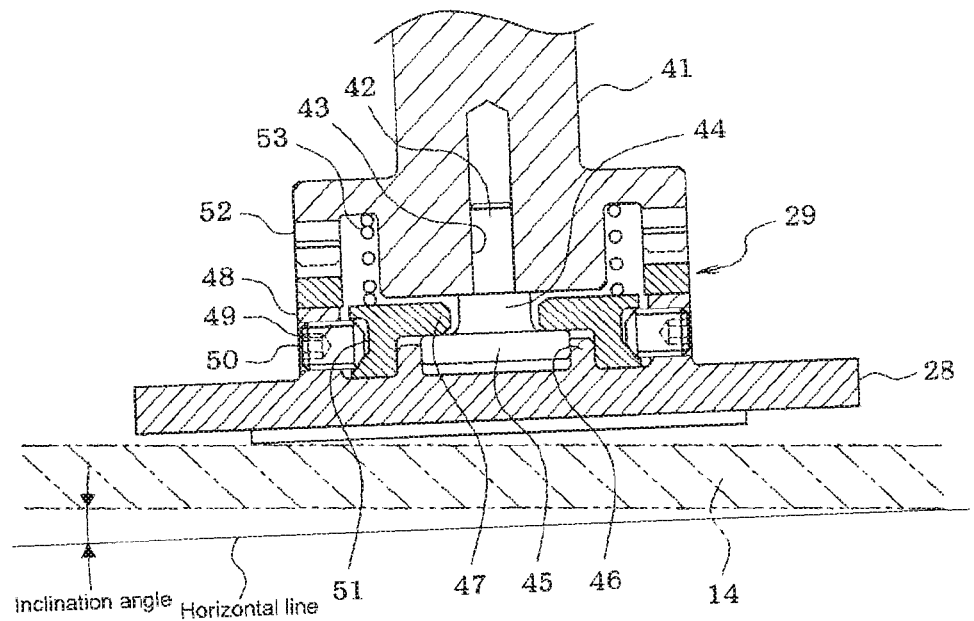
FIG. 4 is an enlarged cross section of a following mechanism of the pressing tool and a surrounding portion.
Figure 5:
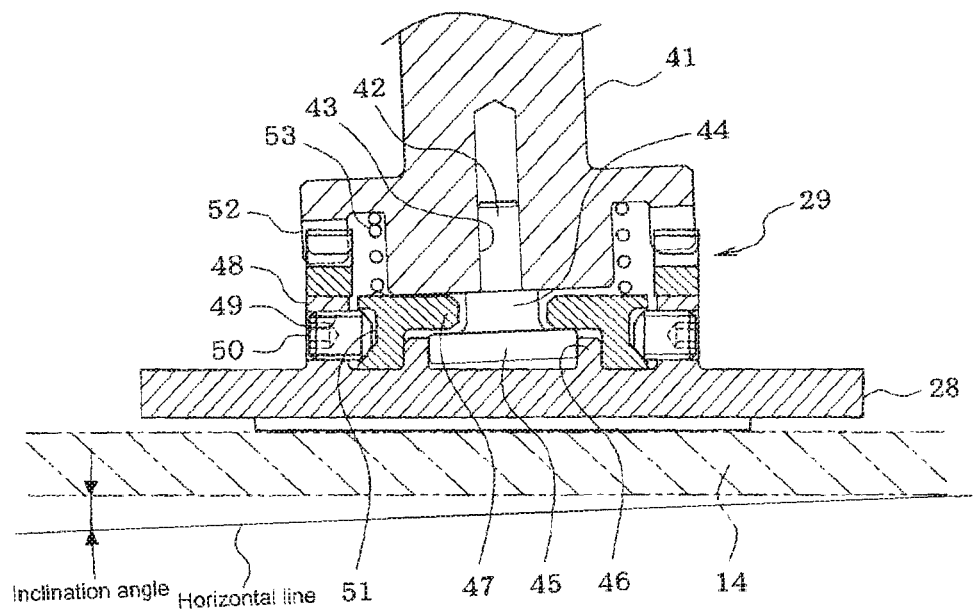
FIG. 5 is an enlarged cross section showing a state after incline adjustment by the following mechanism of the pressing tool.

Next, the configuration of following mechanism 29 of pressing tool 28 is described using FIGS. 4 and 5. Fixing hole 43 for fixing three-leveled pin 42 is formed pointing downwards in a central lower section of base section 41 of following mechanism 29, and leveled pin 42 is inserted from below into fixing hole 43, and attached by a screw or the like, with spacer section 44 formed on leveled pin 42 and disc-shaped supporting section 45 protruding downwards from the lower end surface of base section 41, such that disc-shaped supporting section 45 is fixed horizontally to the lower section of base section 41. Disc-shaped supporting section 45 is formed with a diameter larger than spacer section 44; spacer 44 is formed with a diameter larger than a portion of leveled pin 42 inserted into fixing hole 43, and leveled pin 42 is inserted or screwed into fixing hole 43 until the upper end surface of spacer section 44 contacts the lower end surface base section 41, such that a gap equivalent to the thickness of spacer section 44 is maintained between the upper end outer circumferential surface of disc-shaped supporting section 45 and the lower end surface of base section 41.

On the other hand, round flange section 46 that engages with disc-shaped support section 45 on the base section 41 side is formed going up from the upper surface side of pressing tool 28, and round flange section 46 is engaged with clearance on the outer circumferential side of disc-shaped support section 45 so as to be movable vertically and able to be inclined.

Ring-shaped stopper 47 is inserted into space section 44 of leveled pin 42 with a specified clearance. The internal diameter of stopper 47 is formed to be smaller than the outer diameter of disc-shaped support section 45, and the thickness of the portion of stopper 47 that engages with spacer section 44 is formed to be a specified dimension smaller than the thickness of spacer section 44, therefore, stopper 47 is engageably held on the upper surface side of the outer circumferential section of disc-shape support section 45 so as to be movable vertically and able to be inclined.

Tube section 48 is formed upwards on the upper surface side of pressing tool 28 so as to enclose ring-shaped stopper 47, and by securing screw 50 from the outside to screw hole 49 formed in tube section 48, the tip section of screw 50 is engaged with recess 51 formed in the outer circumferential surface of stopper 47 such that pressing tool 28 and stopper 47 are fixed to each other. By this, support block 26 supports pressing tool 28 via following mechanism 29 so as to be able to be inclined in any direction around 360 degrees.

Tube section 52 with a diameter the same as tube section 48 of pressing tool 28 is formed on the lower section of base section 41 of following mechanism 29, and stopper 47 and pressing tool 28 are biased downwards by spring 53 attached on the inside circumferential side of tube section 52.

Next, operation and effects of pressing tool 28 and following mechanism 29 configured as above will be described. In the present embodiment, because round flange section 46 provided upwards on the upper surface side of pressing tool 28 is engaged with a clearance to the outer circumferential side of disc-shaped support section 45 provided on base section 41 so as to be vertically movable and able to be inclined, as shown in FIG. 4, when pressing tool 28 contacts die 14 to be bonded, as shown in FIG. 5, the side of pressing tool 28 that contacts die 14 only is pushed up against spring 53, and the side that does not contact die 14 is not pushed up until it contacts die 14. By this, pressing tool 28 is inclined along the incline of die 14, and the contact at just one side is eliminated. Further, because the clearance between round flange 46 on the pressing tool 28 side and disc-shaped support section 45 on the base section 41 side is just enough to enable the former to engage with the latter so as to be vertically movable and able to be inclined, the positional deviation in the horizontal direction of pressing tool 28 due to the inclining of pressing tool 28 is kept with the range of the clearance, such that the positional deviation amount in the horizontal direction of pressing tool 28 due to the inclining of pressing tool 28 is reduced. Accordingly, it is possible to apply pressure evenly and bond accurately even for a die 14 on a circuit board 17 with warpage.

Control device 38 of electronic component mounter 38 functions as a control means to control operation such that: die 14 on wafer pallet 13 of die supply device 12 is picked up by a suction nozzle of mounting head 19 and mounted on the bonding section of circuit board 17 conveyed into electronic component mounter 11 by conveyor 18, and, after die 14 is mounted, conveyance of circuit board 17 is stopped when circuit board 17 is conveyed by conveyor 18 such that die 14 on the bonding section of circuit board 17 is below one of the multiple support blocks 26 of electronic component bonding device 25, then the support block 26 is lowered by driving mechanism 26 of the support block 26 such that the die 14 is bonded to the bonding section of the circuit board 17 by pressing tool 28 of the support block 26.

Further, control device 38 of electronic component mounter 1, when bonding die 14 on the bonding section of circuit board 17 with pressing tool 28 of support block 26, detects the pressure force based on an output signal of load cell 37, and controls lowering operation of support block 26 by driving mechanism 27 such that the pressure force during bonding is a target pressure force (specified value A). Here, feedback control may be performed such that support block 26 is lowered during each bonding operation such that the detection value of the pressure force is specified value A, or, the pressure force during bonding may be detected during testing before production, and production may be started after deciding a lowering amount for support block 26 such that the pressure force during bonding operation is specified value A. Alternatively, the pressure force during bonding may be monitored during production, and if the pressure force during bonding increases or decreases outside a range from target value A to specified value B, the lowering amount of support block 26 may be increased or decreased by specified amount C. Also, a profile of the pressure force detected by load cell 37 may be created, and a database of production information may be created to support operators.

According to the above embodiment, because support block 26 is configured to support each of the multiple pressing tools 28 via following mechanism 29 that allows the pressing tool 28 to incline in any direction around 360 degrees, when support block 26 is lowered by driving mechanism 27 and pressure is applied to die 14 on the bonding section of circuit board 17 by pressing tool 28, an incline of pressing tool 28 is automatically adjusted by following mechanism 29 to match the incline of die 14 on the bonding section of circuit board 17, such that die 14 is bonded to the bonding section of circuit board 17 with high accuracy with pressure being applied evenly to die 14 while levelness is maintained between pressing tool 28 and die 14 (the bonding section of circuit board 17). Accordingly, without performing an incline measuring step or an incline adjustment step before starting production, it is possible to maintain mounting reliability of die 14 and improve productivity while not needing a conventional incline measuring device or incline adjustment device, therefore manufacturing costs of electronic component bonding device 25 are reduced.

Further, because multiple pressing tools 28 are supported on a single support block 26 via following mechanisms 29, it is possible to move multiple pressing tools 28 in a vertical direction using a single driving mechanism 27, such that the configuration of the driving system can be simplified, pressure can be applied to multiple dies 14 by the multiple pressing tools 28 of the single support block 26 at the same time, or pressure can be applied to a single die 14 by the multiple pressing tools 28 at the same time, meaning that various production types (size of die 14 to be bonded, die quantity, board size, and so on) can be handled.

In this case, because the multiple pressing tools 28 supported by support block 26 are each able to incline via following mechanism 29 in any direction around 360 degrees, it is easier to perform incline adjustment on each pressing tool 28 individually, to match the unevenness of 17 circuit board or the incline of die 14.

Note that, in a case in which the quantity of dies 14 to be bonded to circuit board 17 is small, or a case in which circuit board 17 is small, electronic component bonding device 25 may be provided with only one support block 26, but in the present embodiment, multiple support blocks 26 are provided, each support block 26 is provided with driving mechanism 27, and each support block 26 is driven individually in a vertical direction by the respective driving mechanisms 27, therefore, even when bonding a relatively large amount of dies 14 onto a large circuit board 17, it is possible to perform bonding onto the bonding section of circuit board 17 with high accuracy while applying pressure evenly to each die 14 and maintaining a state of levelness between each of the multiple pressing tools 28 of the multiple support blocks 26 and the respective dies 14 (bonding sections of circuit board 17). In this case, it is not necessary to simultaneously lower all of the multiple support blocks 26, it is fine to lower only the support block 26 positioned above the die 14 on the bonding section of circuit board 17.

Further, in the present embodiment, multiple support blocks 26 are arranged in the width direction of circuit board 17, circuit board 17 is conveyed by conveyor 18, conveyance of circuit board 17 is stopped when die 14 on the bonding section of circuit board 17 is below one of the multiple support blocks 26, and support block 26 is lowered by driving mechanism 27 of support block 26, such that die 14 is bonded to the bonding section of circuit board 17 by pressing tool 28 of support block 26, therefore, even without moving support block 26 in a horizontal direction (X direction and/or Y direction), it is possible to move die 14 on the bonding section of circuit board 17 below support block 26, and to bond die 14 to the bonding section of circuit board 17.

However, with the present disclosure, support block 26 may be moved in a horizontal direction with respect to a stationary circuit board 17, with support block 26 being moved above die 14 on the bonding section of circuit board 17 and then bonding performed, that is, at least one of the support block 26 or circuit board 17 may be moved in the horizontal direction, support block 26 and die 14 on the bonding section of circuit board 17 may be moved vertically, and then bonding performed.

Also, with the present embodiment, load cell 37 that detects the pressure force applied to die 14 on the bonding section of circuit board 17 by pressing tool 28 is provided, and lowering operation of support block 26 by driving mechanism 27 is controlled such that the pressure force during bonding detected by load cell 37 is specified value A, therefore, it is possible to control the pressure force during bonding to be the target pressure force (specified value A).

Further, because support block 26 attached to raising and lowering member 36 of driving mechanism 27 is exchangeble with a support block 26 for which the quantity and/or size of pressing tools 28 is different, the quantity or size of pressing tools 28 of support blocks 26 can be easily changed during changeover to suit the production type (size and quantity of dies 14 to be bonded, board size, and so on), and changeover workability is improved.

Note that, in the present embodiment, electronic component bonding device 25 is provided inside electronic component mounter 11, but the electronic component bonding device may be provided separate to the electronic component mounter and may be arranged in a line such that the electronic component bonding device is on the board unloading side of the electronic component mounter.

Further, the present disclosure is not limited to the above embodiment and it goes without saying that various embodiments with changes that do not extend beyond the scope of the disclosure are possible, such as that electronic components bonded to the bonding section of circuit board 17 are not limited to dies, chip components other than dies may be used, the driving source of driving mechanism 27 is not limited to an air cylinder, a motor may be used, and, the configuration of following mechanism 29 may be changed appropriately.

REFERENCE SIGNS LIST

11: electronic component mounter; 12: die supply device (electronic component supply device); 14: die (electronic component); 17: circuit board; 18: conveyor; 19: mounting head; 25: electronic component bonding device; 26: support block; 27: driving mechanism; 28: pressing tool; 29: following mechanism; 30: air cylinder; 34: connecting member; 36: raising and lowering member; 37: load cell (pressure detecting means); 38: control device (control means)

The invention claimed is:

1. An electronic component bonding device for applying pressure to an electronic component loaded on a bonding section of a circuit board so as to bond the electronic component to the bonding section of the circuit board, the electronic component bonding device comprising:
    multiple pressing tools configured to apply pressure to the electronic component on the bonding section of the circuit board;
    a support block configured to support each of the multiple pressing tools via a following mechanism that allows the pressing tool to incline in any direction around 360 degrees; and
    a drive mechanism configured to drive the support block in a vertical direction, and, via lowering operation, apply pressure to the electronic component on the bonding section of the circuit board using one of the multiple pressing tools and bond the electronic component to the bonding section of the circuit board, wherein
    an upper side of each of the multiple pressing tools includes a round flange section, and
    the following mechanism includes a disc-shaped support section that engages with the round flange section to incline the respective pressing tool.

2. The electronic component bonding device according to claim 1, including multiple of the support blocks, wherein
    the drive mechanism is provided on each of the support blocks, and each support block is moved in the vertical direction separately by the respective driving mechanisms.

3. The electronic component bonding device according to claim 2, including a conveyor configured to convey the circuit board, wherein
    the multiple support blocks are arranged in a width direction of the circuit board conveyed by the conveyor, and
    when the circuit board is conveyed by the conveyor such that the electronic component on the bonding section of the circuit board has reached below one of the multiple support blocks, conveyance of the circuit board is stopped, the support block is lowered by the support block driving mechanism, and the electronic component is bonded to the bonding section of the circuit board using the pressing tool of the support block.

4. The electronic component bonding device according to claim 1, further comprising:
    a pressure detecting means configured to detect a pressure force applied to the electronic component on the bonding section of the circuit board by the pressing tool; and
    a control device configured to control lowering operation of the support block by the driving mechanism such that the pressure force during bonding detected by the pressure detecting means is a specified value.

5. The electronic component bonding device according to claim 1, wherein
    the support block is attached to be exchangeable with a support block for which the quantity of the pressing tool and/or the size of the pressing tool is different.

6. An electronic component mounter comprising:
    the electronic component bonding device according to claim 1; and
    an electronic component supply device configured to supply electronic components, wherein
    an electronic component supplied by the electronic component supply device is picked up by a suction nozzle, loaded on the loading section of the circuit board, and then the electronic component is bonded to the bonding section of the circuit board by the electronic component bonding device.

7. The electronic component bonding device according to claim 1, wherein
    the following mechanism includes a stopper above the disc-shaped support section on a side opposite to the round flange section, and
    the following mechanism includes a spring that biases the stopper toward the round flange section.

* * * * *